US009520577B2

(12) United States Patent
Sato et al.

(10) Patent No.: US 9,520,577 B2
(45) Date of Patent: *Dec. 13, 2016

(54) ORGANIC ELECTROLUMINESCENCE DISPLAY DEVICE AND METHOD OF MANUFACTURING THE SAME

(71) Applicant: Japan Display Inc., Tokyo (JP)

(72) Inventors: Toshihiro Sato, Tokyo (JP); Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/690,591

(22) Filed: Apr. 20, 2015

(65) Prior Publication Data

US 2015/0228924 A1 Aug. 13, 2015

Related U.S. Application Data

(63) Continuation of application No. 14/463,768, filed on Aug. 20, 2014, now Pat. No. 9,040,978.

(30) Foreign Application Priority Data

Aug. 21, 2013 (JP) ................................ 2013-171627

(51) Int. Cl.
*H01L 29/08* (2006.01)
*H01L 51/52* (2006.01)
(Continued)

(52) U.S. Cl.
CPC ....... *H01L 51/5246* (2013.01); *H01L 27/3244* (2013.01); *H01L 27/3276* (2013.01);
(Continued)

(58) Field of Classification Search
CPC .. H01L 27/3244; H01L 51/5237; H01L 51/56; H01L 51/5253
(Continued)

(56) References Cited

U.S. PATENT DOCUMENTS 9,040,978 B2 * 5/2015 Sato .................... H01L 27/3244
257/40
2003/0064171 A1 4/2003 Burrows et al.
(Continued)

FOREIGN PATENT DOCUMENTS

JP 4303591 B2 5/2009

*Primary Examiner* — Douglas Menz
(74) *Attorney, Agent, or Firm* — Typha IP LLC (57) ABSTRACT

A sealing film includes a first inorganic layer that has, in a surface thereof, a convex portion corresponding to an upper surface of an element layer, a second inorganic layer that covers the first inorganic layer, and an organic layer disposed between these layers. The surface of the first inorganic layer includes a recurved area changed from an area around the convex portion to the convex portion, and a flat area surrounding the element layer. The flat area includes an outer peripheral area on an outer end of the first inorganic layer, and an inner peripheral area between the outer peripheral area and the recurved area. The organic layer has an end in the outer peripheral area, has another portion in the recurved area, and avoids the inner peripheral area. A part of the second inorganic layer contacts the first inorganic layer in the inner peripheral area.

19 Claims, 8 Drawing Sheets (51) Int. Cl.
*H01L 51/56* (2006.01)
*H01L 51/00* (2006.01)
*H01L 51/50* (2006.01)
*H01L 27/32* (2006.01)

(52) U.S. Cl.
CPC ...... *H01L 51/0008* (2013.01); *H01L 51/5012* (2013.01); *H01L 51/5206* (2013.01); *H01L 51/5221* (2013.01); *H01L 51/5253* (2013.01); *H01L 51/56* (2013.01); *H01L 2251/301* (2013.01); *H01L 2251/566* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 2007/0132381 | A1* | 6/2007 | Hayashi | H01L 51/5237 313/512 |
| 2010/0019654 | A1* | 1/2010 | Hayashi | H01L 51/5237 313/498 |
| 2014/0042408 | A1* | 2/2014 | Akagawa | H01L 51/5253 257/40 |
| 2014/0367661 | A1* | 12/2014 | Akagawa | H01L 51/5256 257/40 |
| 2015/0207100 | A1* | 7/2015 | Saito | H01L 51/5237 257/40 |

\* cited by examiner

ORGANIC ELECTROLUMINESCENCE DISPLAY DEVICE AND METHOD OF MANUFACTURING THE SAME

CROSS-REFERENCE TO RELATED APPLICATION

The application is a continuation of U.S. application Ser. No. 14/463,768, filed on Aug. 20, 2014, which claims priority from Japanese application JP2013-171627 filed on Aug. 21, 2013, the entire contents of which are hereby incorporated by reference into this application.

BACKGROUND OF THE INVENTION

1. Field of the Invention

The present invention relates to an organic electroluminescence display device and a method of manufacturing the display device.

2. Description of the Related Art

The organic electroluminescence display device requires a sealing structure for blocking an organic EL (electroluminescence) film such as a light emitting layer from atmosphere. For example, a structure has been known in which a sealing film having a multilayer structure in which an organic film made of, for example, resin is sandwiched between inorganic films is used for sealing the organic EL film. This structure obtains a high barrier performance with the provision of the organic film in the sealing film. However, the exposure of the organic film from an end of the sealing film forms a penetration path of moisture and oxygen. Also, Japanese Patent No. 4303591 discloses a structure in which the organic film which is an intermediate layer is made smaller in size than the inorganic films, and an end of the organic film is sealed with the inorganic films.

SUMMARY OF THE INVENTION

Now, in order to realize the structure in which the end of the organic film is sealed with the inorganic film, an additional process for limiting a size of the organic film is required. Also, since the inorganic films are stacked on the end of the sealing film, when a multiple chamfering large panel is diced into singulated panels, a stress is concentrated on the inorganic films to have the potential to generate crack. Also, when the respective inorganic films come in contact with each other, the inorganic films are liable to be separated from each other on an interface thereof.

The present invention aims at preventing the crack from being generated in the inorganic films without any addition of a process, and preventing the inorganic films from being separated from each other.

(1) According to the present invention, there is provided an organic electroluminescence display device including: a circuit substrate; an element layer that is formed on the circuit substrate with the inclusion of an organic electroluminescence film, and an anode and a cathode which hold the organic electroluminescence film therebetween, and has a concavo-convex shape in an upper surface opposite to the circuit substrate; and a sealing film that seals the element layer, in which the sealing film includes a first inorganic layer that is disposed on the circuit substrate so as to cover the upper surface of the element layer, and has, in a surface thereof, a convex portion corresponding to the concavo-convex shape of the upper surface, a second inorganic layer that covers the surface of the first inorganic layer and an organic layer disposed between the first inorganic layer and the second inorganic layer, in which the surface of the first inorganic layer includes a recurved area changed from an area around the convex portion to the convex portion, and a flat area flattened at a position surrounding the element layer, in which the flat area includes an outer peripheral area on an outer end of the first inorganic layer, and an inner peripheral area inside of the outer peripheral area, and adjacent to the recurved area, in which the organic layer has an end in the outer peripheral area, has another portion in the recurved area, and is disposed with the avoidance of the inner peripheral area, and in which a part of the second inorganic layer is positioned to come in contact with the surface of the first inorganic layer in the inner peripheral area. According to the present invention, since the sealing film provides the organic layers between the first inorganic layer and the second inorganic layer, the sealing film is excellent in barrier performance. Also, since the organic layers are also arranged on an end of the sealing film, crack or separation can be prevented from being generated by a contact of the first inorganic layer and the second inorganic layer on the end. Atmosphere or moisture is blocked by bringing the first inorganic layer in contact with the second inorganic layer in the inner peripheral area of the flat area.

(2) In the organic electroluminescence display device according to the item (1), the organic layer may be disposed with the avoidance of an upper end of the convex portion.

(3) In the organic electroluminescence display device according to the item (1) or (2), the surface of the first inorganic layer may have a plurality of the convex portions, and has a plurality of the recurved areas at intervals from each other, and the organic layer may be disposed with the avoidance of areas between the adjacent recurved areas.

(4) In the organic electroluminescence display device according to the item (1), the organic layer may be placed on the upper end of the convex portion.

(5) In the organic electroluminescence display device according to the item (4), the surface of the first inorganic layer may have a plurality of the convex portions, and has a plurality of the recurved areas at intervals from each other, and the organic layer may be placed on areas between the adjacent recurved areas.

(6) In the organic electroluminescence display device according to the item (5), portions of the organic layer which are placed on the upper ends of the convex portions, and portions of the organic layer which are placed in the regions between the adjacent recurved areas may be thinner than the portions in the recurved areas.

(7) According to the present invention, there is provided a method of manufacturing an organic electroluminescence display device, including the steps of: forming a sealing film for sealing element layers on a multiple chamfering circuit substrate in which the respective element layers are formed in a plurality of product areas which is diced into a plurality of products; and cutting off the multiple chamfering circuit substrate and the sealing film, in which the element layer includes an organic electroluminescence film, and an anode and a cathode which hold the organic electroluminescence film therebetween, and has a concavo-convex shape in an upper surface opposite to the multiple chamfering circuit substrate, in which the step of forming the sealing film includes the steps of: forming a first inorganic layer on the upper surface of the element layer so as to have, in a surface thereof, a convex portion corresponding to the concavo-convex shape of the upper surface; forming an organic layer on the surface of the first inorganic layer through vapor deposition; and forming a second inorganic layer so as to cover the surface of the first inorganic layer and the organic layer, in which the surface of the first inorganic layer includes a recurved area changed from an area around the convex portion to the convex portion, and a flat area that surrounds the element layer of the respective product areas, and is formed flatly, in which the flat area includes a separating area separated at an interval from the recurved area of the respective product areas, and an adjacent area arranged between the separating area and the recurved areas, and adjacent to the recurved area, in which the vapor deposition has a characteristic that a vapor deposition material is liable to adhere to an area in which the surface shape is changed into a concave shape, and the vapor deposition material is liable to adhere to the recurved area due to the characteristic, and relatively hardly adheres to the adjacent area adjacent to the recurved area in which the organic layer is disposed in the separating area and the recurved area with the avoidance of the adjacent area, and in which in the step of cutting off the multiple chamfering circuit substrate, a portion disposed in the separating area of the first inorganic layer, the organic layer, and the second inorganic layer is cut off. According to the present invention, since the sealing film provides the organic layers between the first inorganic layer and the second inorganic layer, the sealing film is excellent in barrier performance. Also, at the cutting position of the multiple chamfering circuit substrate, the organic layers are disposed between the first inorganic layer and the second inorganic layer, and the organic layers absorb a stress exerted on the first inorganic layer and the second inorganic layer by cutting. As a result, crack can be prevented from being generated in the first inorganic layer or second inorganic layer.

(8) In the method of manufacturing an organic electroluminescence display device according to the item (7), the separating area of the flat area may be an area in which the respective adjacent ends of the adjacent product areas are continuous to each other.

(9) In the method of manufacturing an organic electroluminescence display device according to the item (7) or (8), the organic layer may be formed with the avoidance of an upper end of the convex portion of the first inorganic layer.

(10) In the method of manufacturing an organic electroluminescence display device according to any one of the items (7) to (9), the surface of the first inorganic layer may have a plurality of the convex portions, and have a plurality of the recurved areas at intervals from each other, and the organic layer may be formed with the avoidance of areas between the adjacent recurved areas.

(11) In the method of manufacturing an organic electroluminescence display device according to the item (7) or (8), the organic layer may be placed on the upper end of the convex portion of the first inorganic layer.

(12) In the method of manufacturing an organic electroluminescence display device according to the item (11), the surface of the first inorganic layer may have a plurality of the convex portions, and have a plurality of the recurved areas at intervals from each other, and the organic layer may be placed on areas between the adjacent recurved areas.

(13) In the method of manufacturing an organic electroluminescence display device according to the item (12), portions of the organic layer which are placed on the upper ends of the convex portions, and portions of the organic layer which are placed in the regions between the adjacent recurved areas may be thinner than portions of the organic layer which are placed in the recurved areas.

DETAILED DESCRIPTION OF THE INVENTION

Figure 1:
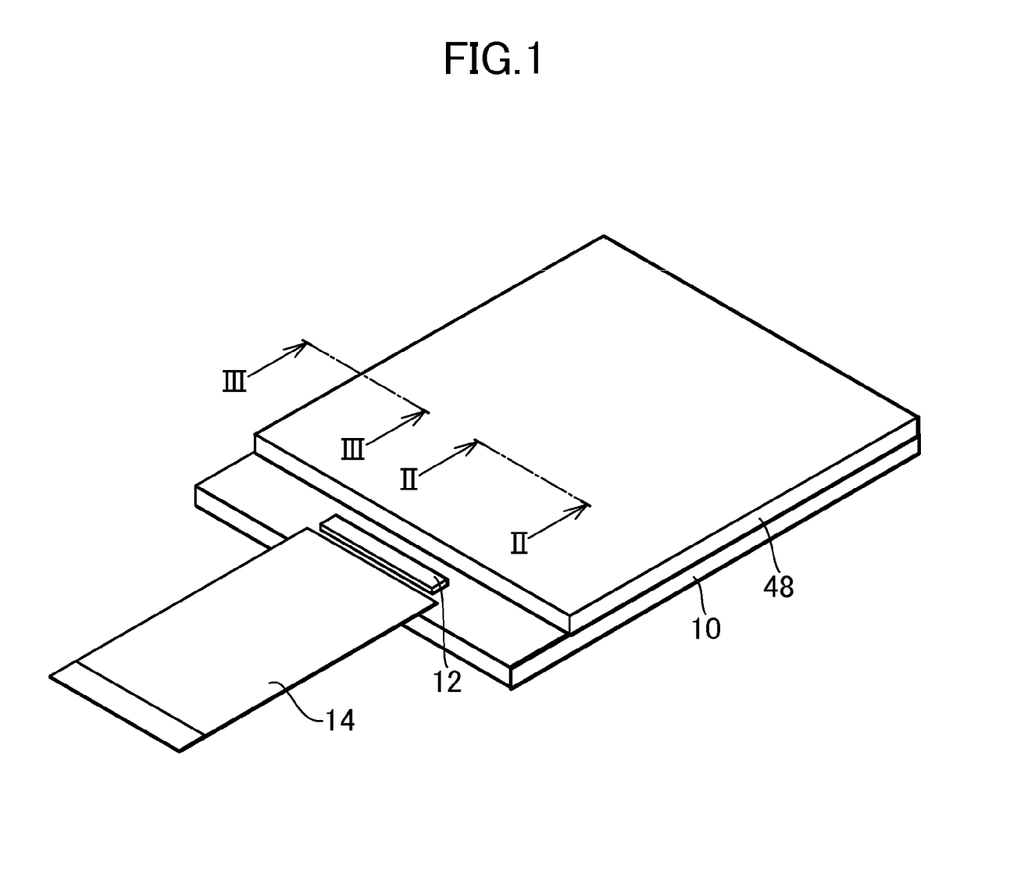
FIG. 1 is a perspective view of an organic electroluminescence display device according to an embodiment of the present invention.
Figure 2:
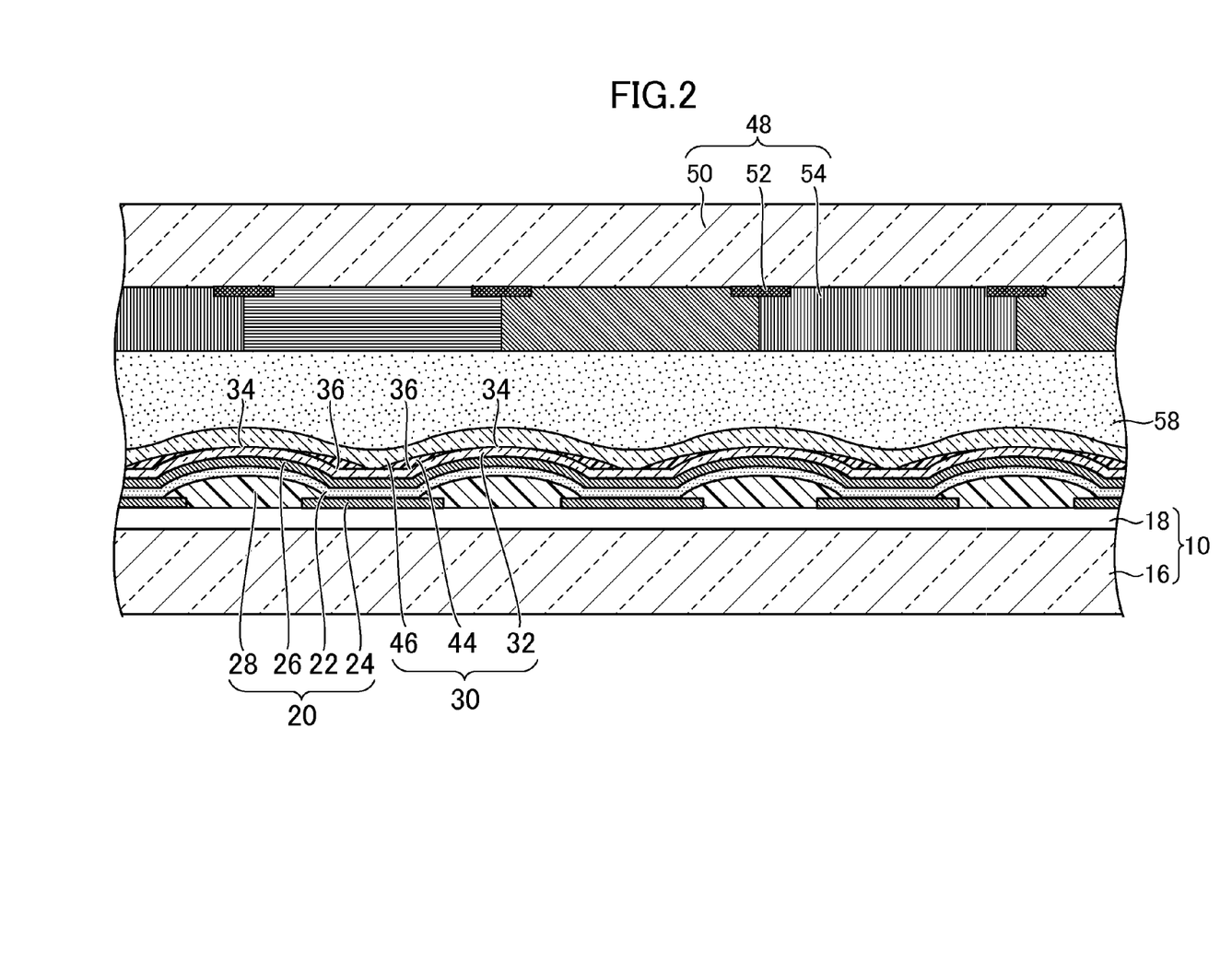
FIG. 2 is a cross-sectional view taken along a line II-II of the organic electroluminescence display device illustrated in FIG. 1.
Figure 3:
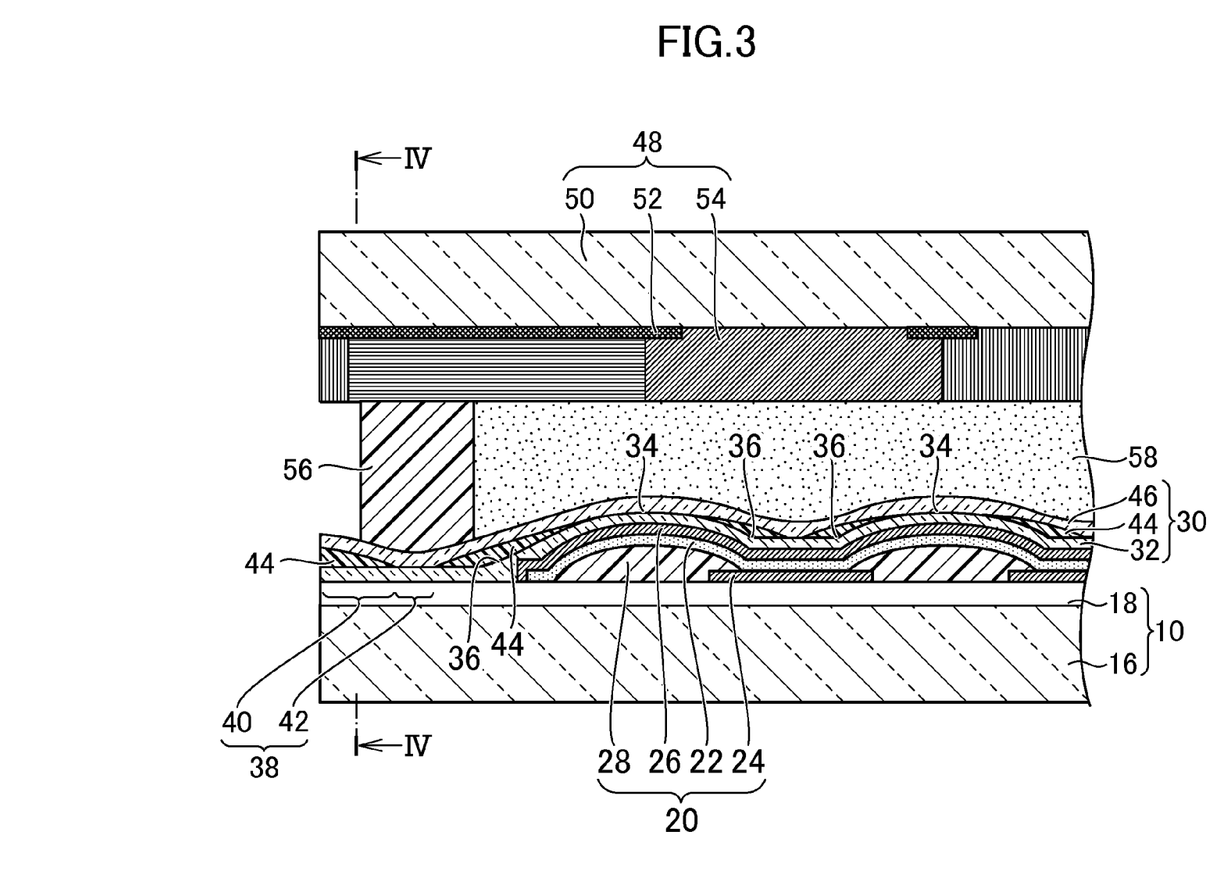
FIG. 3 is a cross-sectional view taken along a line III-III of the organic electroluminescence display device illustrated in FIG. 1.

Hereinafter, an embodiment of the present invention will be described with reference to the drawings. FIG. 1 is a perspective view of an organic electroluminescence display device according to an embodiment of the present invention. FIG. 2 is a cross-sectional view taken along a line II-II of the organic electroluminescence display device illustrated in FIG. 1. FIG. 3 is a cross-sectional view taken along a line III-III of the organic electroluminescence display device illustrated in FIG. 1.

As illustrated in FIG. 1, an organic electroluminescence display device has a circuit substrate 10. On the circuit substrate 10 is mounted an integrated circuit chip 12 for driving an element that displays an image. The circuit substrate 10 is connected with a flexible wiring substrate 14 for electric connection to an external. As illustrated in FIG. 2, the circuit substrate 10 includes a first substrate 16 made of glass, and a circuit layer 18. The circuit layer 18 includes wirings, and electrodes and insulating films for configuring thin film transistors not shown.

As illustrated in FIG. 2, an element layer 20 is disposed over the circuit substrate 10. The element layer 20 includes an organic electroluminescence film 22. The organic electroluminescence film 22 includes at least a light emitting layer, and also may include at least one layer of an electron transport layer, a hole transport layer, an electron injection layer, and a hole injection layer. At least one layer configuring the organic electroluminescence film 22 is made of an organic material. The light emitting layer included in the organic electroluminescence film 22 illustrated in FIG. 2 is configured to emit only a light of one color (for example, white), but may be configured to emit lights of plural colors.

The element layer 20 includes anodes 24 and a cathode 26. The anode 24 and the cathode 26 are electrically connected to the circuit layer 18. In an example of FIG. 2, plural anodes 24 are formed on the circuit layer 18. The plural anodes 24 are disposed in correspondence with a plurality of pixels. The organic electroluminescence film 22 is continuously disposed on the plural anodes 24. The organic electroluminescence film 22 is arranged on the respective anodes 24. The cathode 26 is continuously disposed on the organic electroluminescence film 22. Therefore, the element layer 20 includes the anodes 24 and the cathode 26 with the organic electroluminescence film 22 interposed therebetween. A voltage is applied to the anodes 24 and the cathode 26 to implant holes and electrons into the organic electroluminescence film 22 from the anodes 24 and the cathode 26, respectively, and the implanted holes and electrons are coupled with each other in the light emitting layer to emit a light.

Insulators 28 made of resin are disposed to be placed on ends of the respective anodes 24. The insulators 28 are intervened between the ends of the anodes 24 and the organic electroluminescence film 22 to prevent short circuit between the anodes 24 and the cathode 26. The insulators 28 are banked into a bank shape so as to partition the pixels. With this configuration, the element layer 20 has a concavo-convex shape in an upper surface (a surface of the cathode 26) opposite to the circuit substrate 10.

The element layer 20 is sealed with a sealing film 30. The sealing film 30 includes a first inorganic layer 32. The first inorganic layer 32 is disposed over the circuit substrate 10 so as to cover the upper surface of the element layer 20. The first inorganic layer 32 has plural convex portions 34 in a surface thereof in correspondence with the concavo-convex shape of the upper surface of the element layer 20. A surface of the first inorganic layer 32 has recurved areas 36 changed into the convex portions 34 from areas around the convex portions 34. In detail, a surface of the first inorganic layer 32 has plural recurved areas 36 at intervals from each other.

As illustrated in FIG. 3, the surface of the first inorganic layer 32 has a flat area 38 formed flatly at a position surrounding the element layer 20. The flat area 38 includes an outer peripheral area 40 and an inner peripheral area 42. The outer peripheral area 40 is arranged on an outer end of the first inorganic layer 32 (flat area 38). The inner peripheral area 42 is disposed inside of the outer peripheral area 40, and adjacent to the recurved areas 36.

The sealing film 30 includes organic layers 44. The organic layers 44 partially form the recurved areas 36. The organic layers 44 are disposed with the avoidance of areas between the adjacent recurved areas 36. The organic layers 44 are disposed with the avoidance of upper ends of the convex portions 34 of the first inorganic layer 32. The organic layers 44 are disposed with the avoidance of the inner peripheral area 42 of the flat area 38. The organic layers 44 have an end in the outer peripheral area 40 of the flat area 38.

The sealing film 20 includes a second inorganic layer 46 arranged above the organic layers 44. The second inorganic layer 46 covers a surface of the first inorganic layer 32. The organic layers 44 are disposed between the first inorganic layer 32 and the second inorganic layer 46. Since the sealing film 30 provides the organic layers 44 between the first inorganic layer 32 and the second inorganic layer 46, the sealing film 30 is excellent in barrier performance. A part of the second inorganic layer 46 is located in contact with the surface of the first inorganic layer 32 in the inner peripheral area 42 of the flat area 38. With the above configuration, atmosphere or moisture is blocked with the inner peripheral area 42 of the flat area 38.

Figure 4:
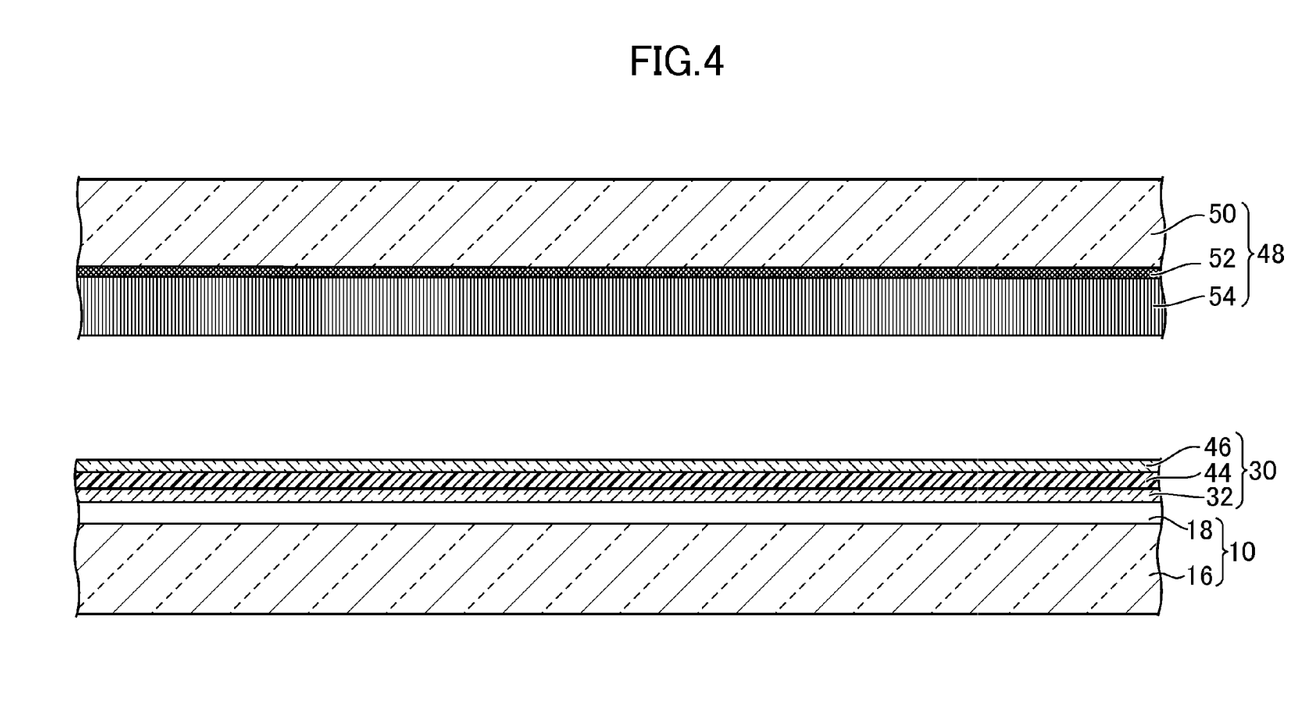
FIG. 4 is a cross-sectional view taken along a line IV-IV of the organic electroluminescence display device illustrated in FIG. 3.

FIG. 4 is a cross-sectional view taken along a line IV-IV of the organic electroluminescence display device illustrated in FIG. 3. As illustrated in FIGS. 3 and 4, since the organic layers 44 are also arranged on an end of the sealing film 30, crack or separation can be prevented from being generated by a contact of the first inorganic layer 32 and the second inorganic layer 46 on the end.

The display device has a counter substrate 48. The counter substrate 48 is arranged to face the circuit substrate 10 with a gap therebetween. The counter substrate 48 is formed of a color filter substrate, and includes a second substrate 50, and a black matrix 52 and a colored layer 54 which are disposed on the circuit substrate 10 side of the second substrate 50. As a modification, if the organic electroluminescence film 22 has plural light emitting layers that emit different colors (for example, red, green, and blue), the colored layer 54 is unnecessary.

As illustrated in FIG. 3, the circuit substrate 10 and the counter substrate 48 are fixed by a seal material 56 disposed on a peripheral end. A filler 58 is disposed on the sealing film 30, and a space between the sealing film 30 and the counter substrate 48 is embedded with the filler 58.

Figure 5:
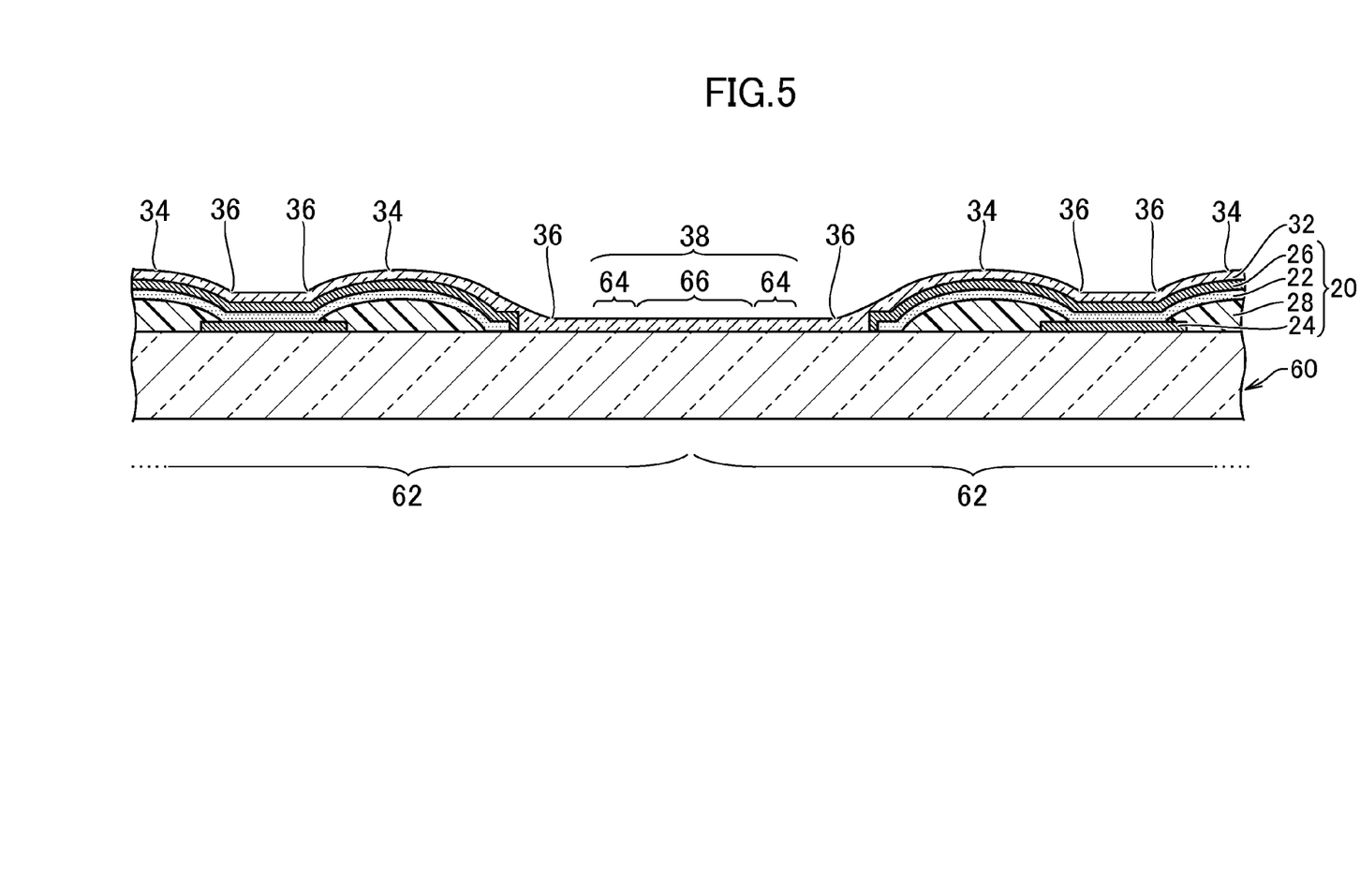
FIG. 5 is a diagram illustrating a method of manufacturing an organic electroluminescence display device according to an embodiment of the present invention.
Figure 6:
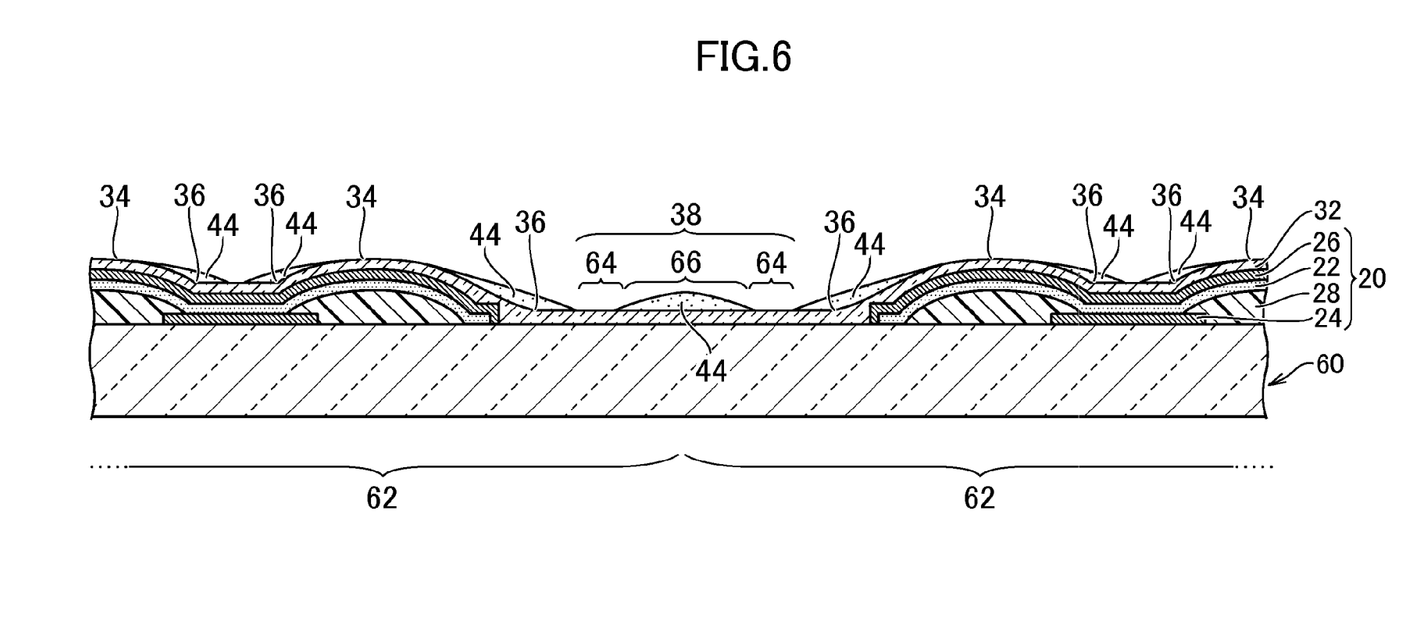
FIG. 6 is a diagram illustrating the method of manufacturing the organic electroluminescence display device according to the embodiment of the present invention.
Figure 7:
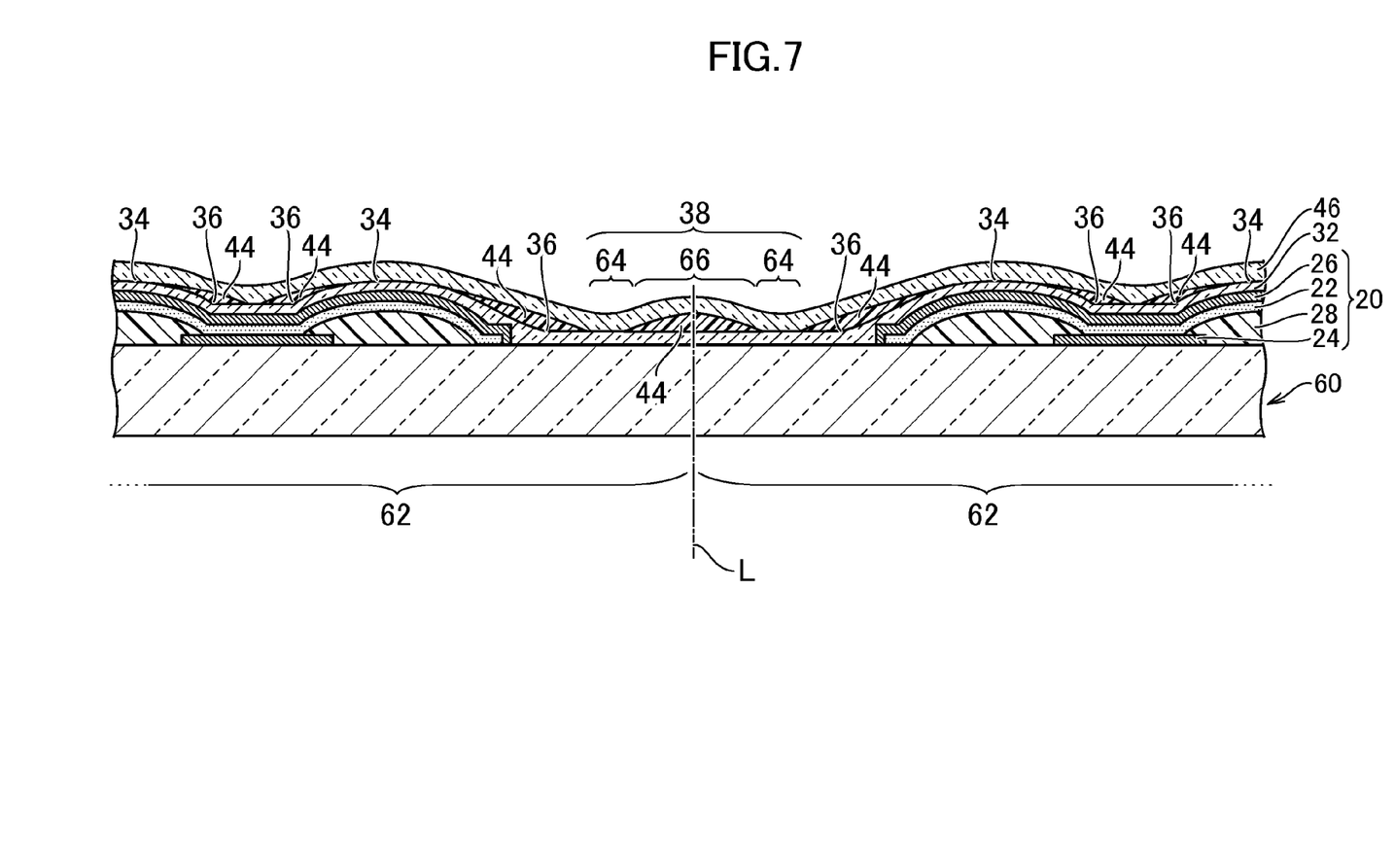
FIG. 7 is a diagram illustrating the method of manufacturing the organic electroluminescence display device according to the embodiment of the present invention.

FIGS. 5 to 7 are diagrams illustrating a method of manufacturing the organic electroluminescence display device according to an embodiment of the present invention. In this embodiment, a multiple chamfering circuit substrate 50 is prepared. The multiple chamfering circuit substrate 60 has plural product areas 62 to be diced into plural products (circuit substrate 10). The above-mentioned element layer 20 is formed in the product areas 62. That is, the element layer 20 includes the organic electroluminescence film 22, and the anodes 24 and the cathode 26 between which the organic electroluminescence film 22 is sandwiched. The organic electroluminescence film 22 is formed through vapor deposition or sputtering. The element layer 20 has a concavo-convex shape in an upper surface opposite to the multiple chamfering circuit substrate 60. The details are described above.

As illustrated in FIG. 5, the first inorganic layer 32 is formed on the upper surface of the element layer 20. The first inorganic layer 32 is formed to have the plural convex portions 34 in the surface in correspondence with the concavo-convex shape of the upper surface of the element layer 20. The first inorganic layer 32 has the recurved areas 36 each having a surface changed from an area around each convex portion 34 into the convex portions 34. The plural recurved areas 36 are formed at intervals from each other.

The first inorganic layer 32 has the flat area 38 in its surface. The flat area 38 is an area that surrounds the element layers 20 of the respective plural product areas 62, and is flat. As will be described above, a cutting line L of the multiple chamfering circuit substrate 60 is positioned in the flat area 38 (refer to FIG. 7).

The flat area 38 that surrounds the element layer 20 includes an adjacent area 64 that is adjacent to the recurved areas 36 located at the outermost side of one product area 62. The flat area 38 includes a separating area 66 separated at an interval from the recurved area 36 located on the outermost side. The adjacent area 64 is arranged between the separating area 66 and the recurved area 36 located on the outermost side. The separating area 66 is located to be sandwiched between the neighboring adjacent areas 64 of the adjacent product areas 62. The separating area 66 is an area in which the respective adjacent ends of the adjacent product areas 62 (areas diced into the individual circuit substrates 10) are continuous to each other.

The first inorganic layer 32 is made of SiN, and can be formed through, for example, a plasma CVD (plasma-enhanced chemical vapor deposition: PECVD) technique. The film formation of SiN is conducted by generation of plasma in a mixture gas containing $SiH_4$, $NH_3$, and $N_2$. The film thickness of SiN can be set to about 500 nm. In a film forming process, it is preferable that the temperature of the multiple chamfering circuit substrate 60 does not increase as much as possible. For example, the film formation is conducted, for example, at 100° C. or lower.

Alternatively, the first inorganic layer 32 can be formed through an arbitrary appropriate process including a conventional vacuum process such as sputtering, vapor deposition, sublimation, CVD, or electron cyclotron resonance plasma enhanced chemical vapor deposition (ECR-PECVD) technique, and the combination thereof.

As illustrated in FIG. 6, the organic layers 44 are formed on the surface of the first inorganic layer 32 by vapor deposition. The vapor deposition has a characteristic that a vapor deposition material is liable to adhere to an area in which the surface shape is changed into a concave shape. The vapor deposition material is liable to adhere to the recurved areas 36 because of this characteristic. Relatively, it is difficult that the vapor deposition material adheres to the adjacent area 64 adjacent to the recurved areas 36. As a result, the organic layers 44 are disposed in the recurved areas 36 with the avoidance of the adjacent area 64. Also, the organic layers 44 are also formed in the separating area 66 distant from the recurved areas 36.

In the same principle that it is difficult that the vapor deposition material adheres to the adjacent area 64 adjacent to the recurved areas 36, it is difficult that the vapor deposition material adheres to an area between the adjacent recurved areas 36. As a result, the organic layers 44 are formed to also avoid the area between the adjacent recurved areas 36. Further, the organic layers 44 are formed with the avoidance of the upper ends of the convex portions 34 of the first inorganic layer 32. This is because the vapor deposition has a characteristic that the vapor deposition material hardly adheres to the area in which the surface shape changes into the convex shape.

As illustrated in FIG. 7, the second inorganic layer 46 is formed to cover the surface of the first inorganic layer 32 and the organic layers 44. The second inorganic layer 46 can be formed from SiN through the same film forming technique as that of the first inorganic layer 32. For example, the second inorganic layer 46 is formed through the PECVD with the temperature of the multiple chamfering circuit substrate 60 as 100° C. or lower as in the first inorganic layer 32. The film thickness of SiN may be set to about 500 nm. The sealing film 30 including the first inorganic layer 32, the organic layers 44, and the second inorganic layer 46 is formed over the multiple chamfering circuit substrate 60 so as to seal the element layer 20. Since the sealing film 30 has the organic layers 44 between the first inorganic layer 32 and the second inorganic layer 46, the sealing film 30 is excellent in the barrier performance.

Then, the multiple chamfering circuit substrate 60 and the sealing film 30 are cut off. The cutting line L is position in the separating area 66. Therefore, a portion provided in the separating area 66 of the first inorganic layer 32, the organic layers 44, and the second inorganic layer 46 is cut off. At the cutting position, the organic layers 44 are disposed between the first inorganic layer 32 and the second inorganic layer 46, and the organic layers 44 absorb a stress exerted on the first inorganic layer 32 and the second inorganic layer 46 by cutting. As a result, crack can be prevented from being generated in the first inorganic layer 32 or second inorganic layer 46.

Figure 8:
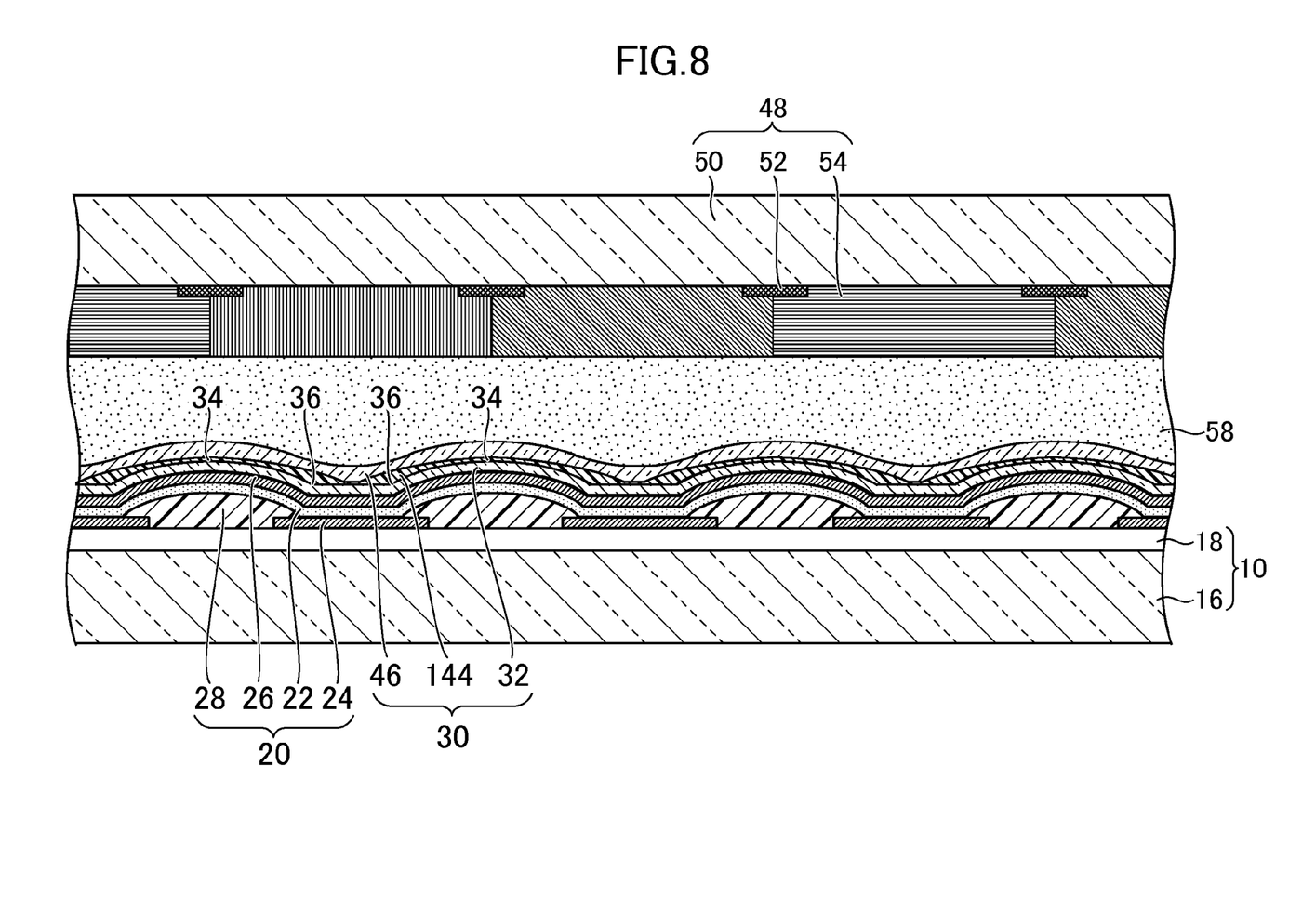
FIG. 8 is a cross-sectional view of an organic electroluminescence display device according to a modification of the embodiment of the present invention.

FIG. 8 is a cross-sectional view of an organic electroluminescence display device according to a modification of the embodiment of the present invention.

In this example, an organic layer 144 is placed on the upper ends of the convex portions 34. The organic layer 144 is also placed in an area between the adjacent recurved areas 36. Portions of the organic layer 144 placed on the upper ends of the convex portions 34, and portions of the organic layer 144 placed in the area between the adjacent recurved areas 36 are thinner than portions of the organic layer 144 in the recurved areas 36. The other details correspond to the details described in the above embodiment.

The organic layer 144 of this shape is formed as resin by forming a film of monomer through an arbitrary appropriate process including a conventional vacuum vapor process such as vapor deposition, sublimation, and the combination thereof, and a coating process such as a nozzle printing method, a spin coat method, a slit coat method, an inkjet method, a relief printing method, an intaglio offset printing method, and by polymerizing the monomer with ultraviolet radiation, or a letterpress reverse offset printing method. In this modification, the organic layer 144 is made of acrylic resin. A melting point of acrylic monomer is −48° C., and a temperature of the multiple chamfering circuit substrate at the time of forming the monomer film is set to, for example, 0° C. As a result, acrylic monomer flows on the surface of the multiple chamfering circuit substrate to which the acrylic monomer adheres, is localized in the concave portion, and smoothen the concavo-convex portion. Thereafter, the acrylic monomer is polymerized.

In the manufacturing process, the organic layer 144 is placed on the upper ends of the convex portions 34 of the first inorganic layer 32. Also, the organic layer 144 is placed on the area between the adjacent recurved areas 36. Then, portions of the organic layer 144 placed on the upper ends of the convex portions 34, and portions of the organic layer 144 placed in the area between the adjacent recurved areas 36 are thinner than portions of the organic layer 144 in the recurved areas 36.

The present invention is not limited to the above embodiments, but can be variously modified. For example, the configurations described in the embodiments can be replaced with the configuration having the substantially identical configurations, or the substantially identical functions, or the configurations that can achieve the identical purpose.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device, comprising:
   a first substrate;
   an element layer provided on the first substrate, wherein the element layer comprises an anode electrode, an organic electroluminescence film, and a cathode electrode;
   a first inorganic layer provided over the element layer; and
   a second inorganic layer provided over the first inorganic layer, wherein the second inorganic layer at least partially contacts with the first inorganic layer,
   wherein an upper surface of the first inorganic layer and a lower surface of the second inorganic layer are separated from each other by a predetermined distance above an edge portion of the first substrate.

2. The organic electroluminescence display device according to claim 1,
   wherein a first region which includes the element layer is arranged around a second region, where the second inorganic layer is in contact with the first inorganic layer, and the upper surface of the first inorganic layer and the lower surface of the second inorganic layer are separated from each other.

3. The organic electroluminescence display device according to claim 2,
wherein the upper surface of the first inorganic layer includes a first flat area and a second flat area,
wherein each of the first and second inorganic layers includes SiN,
wherein the lower surface of the second inorganic layer includes a first curved area and a third flat area,
wherein the third flat area of the lower surface is in contact with the second flat area of the upper surface, and
wherein there is the predetermined distance between the first flat area of the upper surface and the first curved area of the lower surface.

4. The organic electroluminescence display device according to claim 3,
further comprising a first organic layer between the first flat area of the upper surface and the first curved area of the lower surface,
wherein the first inorganic layer, the first organic layer, and the second inorganic layer each have a side exposed to outside on the edge portion of the first substrate.

5. The organic electroluminescence display device according to claim 4,
further including a circuit layer between the first substrate and the element layer; and
a second organic layer,
wherein the upper surface of the first inorganic layer includes a second curved area ascending from the first substrate and a boundary between the second curved area and the second flat area, the second flat area lying between the boundary and the first flat area,
wherein the second organic layer sits on the boundary,
wherein the edge portion of the first substrate has a side which is flush with an edge of the first flat area and an edge of the first curved area.

6. The organic electroluminescence display device according to claim 5,
wherein a seal film, which includes the first and second inorganic layers and the first and second organic layers, seals the element layer; and
wherein the first and second curved areas, the boundary, the first, second and third flat areas are arranged in the second region.

7. The organic electroluminescence display device according to claim 1, further comprising:
a plurality of light emitting elements provided on the first substrate, wherein each of the plurality of light emitting elements comprises an anode electrode, an organic electroluminescence film, and a cathode electrode,
wherein the first inorganic layer provided over the plurality of light emitting elements; and
a first organic layer provided on the first inorganic layer;
wherein the second inorganic layer provided over the first inorganic layer and the first organic layer, wherein the second inorganic layer at least partially contacts with the first inorganic layer, and
wherein the first inorganic layer, the first organic layer, and the second inorganic layer are sequentially laminated from beneath above an edge portion of the first substrate.

8. The organic electroluminescence display device according to claim 7,
wherein a first region which includes the plurality of light emitting elements is arranged around a second region, where the first organic layer is in contact with the first inorganic layer, and the first inorganic layer, the first organic layer, and the second inorganic layer are sequentially laminated from beneath.

9. The organic electroluminescence display device according to claim 8,
wherein an upper surface of the first inorganic layer includes a first flat area and a second flat area,
wherein each of the first and second inorganic layers includes SiN,
wherein a lower surface of the second inorganic layer includes a first curved area and a third flat area,
wherein the third flat area of the lower surface is in contact with the second flat area of the upper surface, and
wherein the first organic layer lies between the first curved area and the first flat area.

10. The organic electroluminescence display device according to claim 9,
wherein the first inorganic layer, the first organic layer, and the second inorganic layer each have a side exposed to outside on the edge portion of the first substrate.

11. The organic electroluminescence display device according to claim 10,
further including a circuit layer between the first substrate and the plurality of light emitting elements; and
a second organic layer,
wherein the upper surface of the first inorganic layer includes a second curved area and a boundary between the second curved area and the second flat area, the second flat area lying between the boundary and the first flat area,
wherein each of the first and second curved areas ascends from the first substrate,
wherein the second organic layer sits on the boundary,
wherein the edge portion of the first substrate has a side which is flush with an edge of the first flat area and an edge of the first curved area.

12. The organic electroluminescence display device according to claim 11,
wherein a seal film, which includes the first and second inorganic layers and the first and second organic layers, seals the plurality of light emitting elements; and
wherein the first and second curved areas, the boundary, the first, second and third flat area are arranged in the second region.

13. The organic electroluminescence display device according to claim 1, further comprising:
a plurality of light emitting elements provided on the first substrate, wherein each of the plurality of light emitting elements comprises an anode electrode, an organic electroluminescence film, and a cathode electrode,
wherein the first inorganic layer provided over the plurality of light emitting elements, wherein the first inorganic layer has a first flat area, which is a part of an upper surface thereof,
wherein the second inorganic layer provided over the first inorganic layer and at least partially contacts with the first inorganic layer, wherein the second inorganic layer has a first curved area, which is a part of a lower surface thereof, and
wherein the first flat area and the first curved area face each other without directly contacting with each other at an edge portion of the first substrate.

14. The organic electroluminescence display device according to claim 13,
wherein a first region which includes the plurality of light emitting elements is arranged around a second region, where the first flat area of the upper surface and the first curved area of the lower surface are opposed to each other.

15. The organic electroluminescence display device according to claim 14,
further comprising a first organic layer between the first and second inorganic layers,
wherein each of the first and second inorganic layers includes SiN.

16. The organic electroluminescence display device according to claim 15,
wherein the upper surface of the first inorganic layer includes a second flat area,
wherein the lower surface of the second inorganic layer includes a third flat area,
wherein the third flat area of the lower surface is in contact with the second flat area of the upper surface, and
wherein the first organic layer lies between the first curved area and the first flat area.

17. The organic electroluminescence display device according to claim 16,
wherein the first inorganic layer, the first organic layer and the second inorganic layer each have a side exposed to outside on the edge portion of the first substrate.

18. The organic electroluminescence display device according to claim 17,
further including a circuit layer between the first substrate and the plurality of light emitting elements; and
a second organic layer,
wherein the upper surface of the first inorganic layer includes a second curved area and a boundary between the second curved area and the second flat area, the second flat area lying between the boundary and the first flat area,
wherein each of the first and second curved areas ascends from the first substrate,
wherein the second organic layer lies on the boundary,
wherein the edge portion of the first substrate has a side which is flush with an edge of the first flat area and an edge of the first curved area.

19. The organic electroluminescence display device according to claim 18,
wherein a seal film, which includes the first and second inorganic layers and the first and second organic layers, seals the plurality of light emitting elements; and
wherein the first and second curved areas, the boundary, the first, second and third flat areas are arranged in the second region.

* * * * *